(12) United States Patent
Gregory et al.

(10) Patent No.: US 11,910,566 B1
(45) Date of Patent: Feb. 20, 2024

(54) PROCESSOR HEAT EXCHANGER WITH SEPARATE MOUNTING STRUCTURE

(71) Applicant: Amazon Technologies, Inc., Seattle, WA (US)

(72) Inventors: Luke Thomas Gregory, Mercer Island, WA (US); Darin Lee Frink, Lake Tapps, WA (US); Rick Chun Kit Cheung, Lynwood, WA (US); Nafea Bshara, Cupertino, CA (US); Kenny Kiet Huynh, Bothell, WA (US); Noah Kelly, Kingston, WA (US); Priti Choudhary, Seattle, WA (US); Ali Elashri, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 189 days.

(21) Appl. No.: 17/206,023

(22) Filed: Mar. 18, 2021

(51) Int. Cl.
*H01L 23/40* (2006.01)
*H05K 7/20* (2006.01)

(52) U.S. Cl.
CPC ....... *H05K 7/20281* (2013.01); *H05K 7/2039* (2013.01); *H05K 7/20263* (2013.01)

(58) Field of Classification Search
CPC .............. H01L 23/04; H01L 23/4006; H01L 2023/4081; H01L 2023/4087; H01L 2023/4075
See application file for complete search history.

(56) References Cited

U.S. PATENT DOCUMENTS

| | | | | |
|---|---|---|---|---|
| 3,757,271 A | * | 9/1973 | Judge | H01L 23/4006 361/767 |
| 5,359,493 A | * | 10/1994 | Chiu | H01L 23/4006 361/709 |
| 7,471,517 B1 | * | 12/2008 | Desrosiers | H05K 7/1053 165/185 |
| 7,639,512 B1 | * | 12/2009 | Xu | H01L 23/4006 361/767 |
| 7,826,215 B2 | * | 11/2010 | Glover | H05K 7/20727 361/679.49 |
| 2004/0085735 A1 | * | 5/2004 | Liu | H01L 23/4006 257/E23.084 |
| 2005/0022973 A1 | * | 2/2005 | Lee | H01L 23/4093 165/80.3 |
| 2006/0171129 A1 | * | 8/2006 | Berto | H01L 23/4006 257/E23.084 |
| 2007/0211431 A1 | * | 9/2007 | Munch | F28D 15/0275 257/E23.09 |

(Continued)

OTHER PUBLICATIONS

U.S. Appl. No. 17/179,296, filed Feb. 17, 2021, Luke Thomas Gregory, et al.

(Continued)

*Primary Examiner* — Frantz F Jules
*Assistant Examiner* — Jason N Thompson
(74) *Attorney, Agent, or Firm* — Alexander A. Knapp; Kowert, Hood, Munyon, Rankin & Goetzel, P.C.

(57) ABSTRACT

A commonly designed processor heat exchanger decouples the mounting hardware used to mount the heat exchanger to a processor from the heat exchanger itself. This allows a single heat exchanger design to be mounted to various different types of processors using processor customized mounting brackets that engage with flanges extending out from a body of the heat exchanger.

21 Claims, 15 Drawing Sheets

(56) References Cited

U.S. PATENT DOCUMENTS

| | | | | |
|---|---|---|---|---|
| 2009/0135552 | A1* | 5/2009 | Tu | H01L 23/4093 |
| | | | | 361/676 |
| 2009/0244863 | A1* | 10/2009 | Kuo | H01L 23/4338 |
| | | | | 361/783 |
| 2014/0248081 | A1* | 9/2014 | Too | F28F 9/26 |
| | | | | 403/374.1 |
| 2014/0345842 | A1* | 11/2014 | Ma | H01L 23/4006 |
| | | | | 165/185 |
| 2014/0353008 | A1* | 12/2014 | Lin | H05K 1/0203 |
| | | | | 174/252 |
| 2015/0062827 | A1* | 3/2015 | Aizawa | H01L 23/34 |
| | | | | 361/720 |
| 2018/0284852 | A1* | 10/2018 | Rannow | H01L 23/473 |
| 2018/0321715 | A1* | 11/2018 | Gopalakrishna | G06F 1/20 |

OTHER PUBLICATIONS

Intel, "How to Know if the Heatsink is Compatible with the Intel Processor", Retrieved from https://www.intel.com/content/www/us/en/suppport/articles/000030760/processors/intel-core-processors.html on Mar. 18, 2021, pp. 1-2.

NVIDIA, "NVIDIA GPU maximum operating temperature and overheating", Retrieved from https://nvidia.custhelp/app/answers/detail/a_id/2752/related/1 on Mar. 18, 2021, pp. 1-2.

NVIDIA, "Why does my graphics card run hot?", Retrieved from https://nvidia.custhelp/com/app/answers/detail/a_id?2343 on Mar. 18, 2021, pp. 1-2.

Xilinx, "Mechanical and Thermal Design Guidelines for Lidless Flip-Chip Packages Application Note", XAPP1301 (v1.6), Feb. 23, 2021, pp. 1-88.

* cited by examiner

US 11,910,566 B1

PROCESSOR HEAT EXCHANGER WITH SEPARATE MOUNTING STRUCTURE

BACKGROUND

Some computer systems include a number of components that generate waste heat. Such components may include mass storage devices, power supplies, and processors. For example, some computers with multiple processors may generate 400 watts of waste heat. Some known computer systems include a plurality of such larger, multiple-processor computer systems that are configured into rack-mounted components, and then are subsequently positioned within a rack system. Some known rack systems include 40 such rack-mounted computer systems and such rack systems will therefore generate as much as 30 kilowatts of waste heat. Moreover, some known data centers include a plurality of such rack systems.

Some computer systems, which may function as servers, include a number of components that are mounted in an interior of the computer systems. The components, which can include printed circuit boards (for example, a motherboard) and processors, generate waste heat and may be referred to herein as "heat-producing components." For example, a motherboard may support a central processing unit, a graphics processing unit, an application specific integrated circuit, or other types of processors that generate waste heat. Some or all of this waste heat must be removed from such processors to maintain continuous operation of the computer system.

Figure 1:
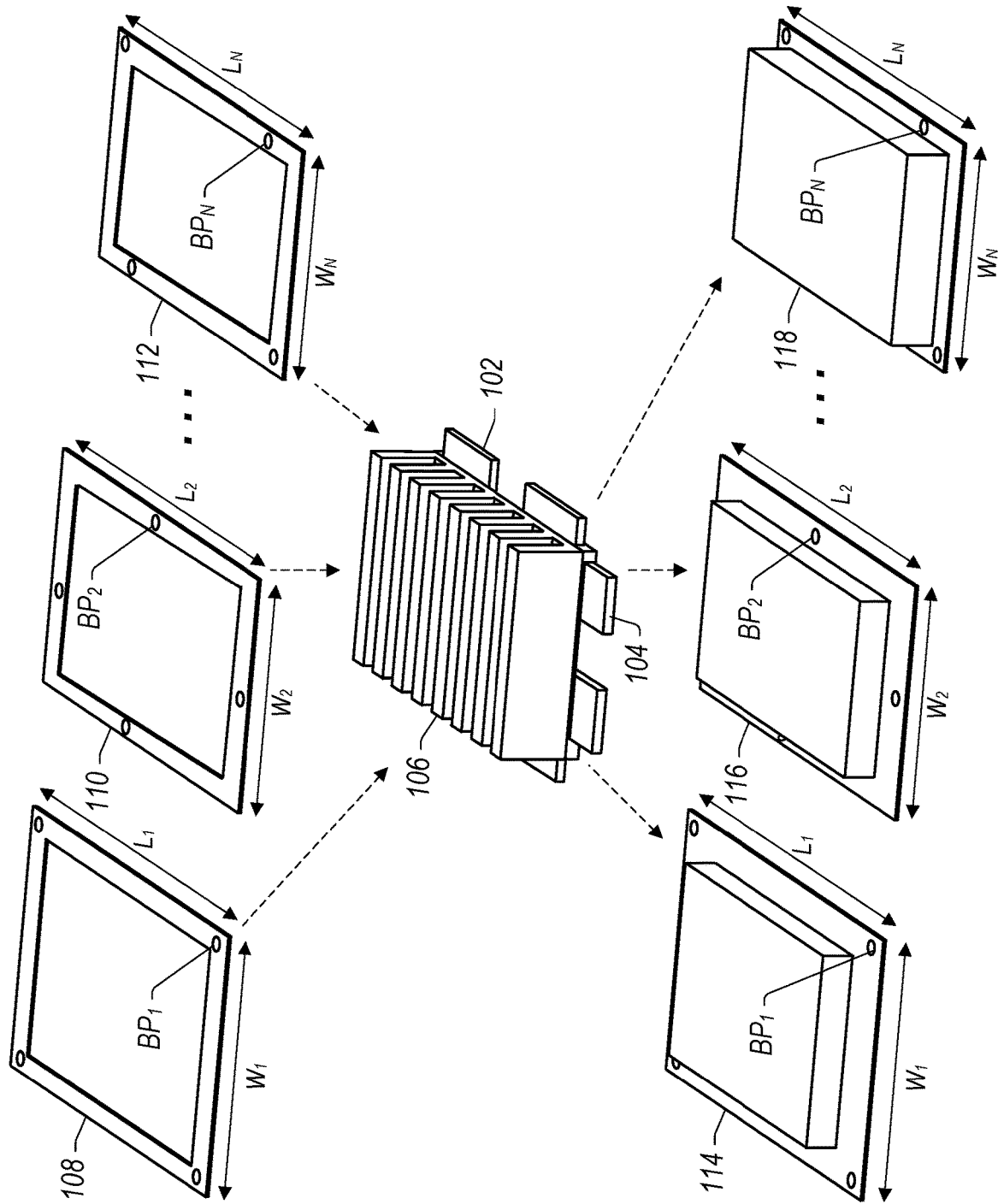
FIG. 1 is an exploded perspective viewing showing different upper mounting brackets that may be used to couple a common heat exchanger design, such as a common heat sink, to different types of processors that have different mounting hardware, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments include a common heat exchanger configured to couple with various different types of processors having different processor package sizes and having different mechanical mounting hardware. As opposed to having bolt holes that must match a bolt pattern and spacing of a given processor type, the heat exchanger includes flanges extending out from respective sides of the heat exchanger. The flanges are configured to engage with a separate mounting structure comprising an upper mounting bracket. The separate mounting structure, including the upper mounting bracket, is selected to compliment mounting hardware for a particular type of processor to which the heat exchanger is to be coupled. For example, a first type of processor may have associated mounting hardware having a first width, a first length, and a first bolt pattern, a second type of processor may have an associated mounting hardware having a second width, a second length, and a second bolt pattern. Additionally, other types of processors may have associated mounting hardware having various other combinations of widths, lengths, and bolt patterns. A common heat exchanger may be mounted to the first, second, or any of the other types of processors using separate mounting structures, that are complimentary to the first, second, or any of the other types of processors. For example, a first mounting bracket may have a first width that is smaller than a width of a second mounting bracket, but the flanges of the heat exchanger may extend out from the heat exchanger a sufficient distance such that the flanges engage with the first mounting bracket having the smaller width or the second mounting bracket having the larger width. Thus, by separating the heat exchanger from the mounting bracket that couples the heat exchanger to the mounting hardware of the processor, the heat exchanger is not required to have any particular mounting arrangement that restricts use of the heat exchanger to being used with any specific type of processor. In this way, a common heat exchanger can be used with various types of processors having associated mounting hardware with various dimensions and fastener layouts.

In some embodiments, the common heat exchanger may be a heat sink, such as a finned or pinned heat sink, or a cold plate (e.g. a structure comprising internal passages for circulating a cooling fluid for heat removal). In some embodiments, a bottom (or first) surface of the heat exchanger may be flat and may be configured to couple with a top surface of a processor package. In some embodiments, a thermal interface material (TIM) (e.g., a thermal grease, thermal gel, thermal putty, thermal paste, etc.) may be used to improve thermal conductivity between the processor package and the heat exchanger. In some embodiments, the heat exchanger may include a heat transfer portion above the bottom surface that is configured to transfer waste heat conducted to the heat exchanger from the processor to a cooling fluid that is in fluid communication with the heat exchanger. For example, the heat exchanger may be a finned or pinned heat sink and may reject heat into air that passes over the heat sink via convective heat transfer. Also, in some embodiments, the heat exchanger may be a cold plate comprising internal passages configured to circulate a cooling fluid and the cold plate may reject heat into the cooling fluid circulated through the internal passages of the cold plate.

In some embodiments, a method includes, providing a heat exchanger for removing heat from a processor wherein the heat exchanger comprises a surface configured to be positioned proximate to a surface of a package of the processor such that waste heat from the processor is conducted to the heat exchanger, a heat transfer portion configured to transfer at least a portion of the heat conducted to the heat exchanger from the processor to a cooling fluid in fluid communication with the heat exchanger, and mounting flanges extending out from respective sides of the heat exchanger, wherein the mounting flanges are configured to engage with a mounting structure for coupling the heat exchanger to the processor. The method further includes selecting the mounting structure to be used to mount the heat exchanger to the processor from various different mounting structures with which the mounting flanges of the heat exchanger are configured to engage, wherein different types of processors or different processor packages require different complementary mounting structures to mount the heat exchanger to the different types of processors or the different processor packages, and wherein the heat exchanger is configured to be mounted on any of the different types of processors or the different processor packages via the different mounting structures with which the mounting flanges of the heat exchanger are configured to engage. The method further includes coupling the heat exchanger with the processor via the selected mounting structure that complements mounting hardware of the processor.

In some embodiments, a heat exchanger for removing waste heat from a processor includes a surface configured to be positioned proximate to a surface of a package of the processor such that waste heat from the processor is conducted to the heat exchanger, a heat transfer portion configured to transfer at least a portion of the heat conducted to the heat exchanger from the processor to a cooling fluid in fluid communication with the heat exchanger, and mounting flanges extending out from respective sides of the heat exchanger, wherein the heat exchanger is configured to be mounted on any of a plurality of different types of processors or different processor packages via different mounting structures with which the mounting flanges of the heat exchanger are configured to engage.

In some embodiments, a mounting assembly for mounting a heat exchanger to a processor includes a mounting bracket configured to accept a heat exchanger positioned within an opening in the mounting bracket, wherein the mounting bracket is further configured to engage flanges of the heat exchanger when the heat exchanger is positioned in the opening of the mounting bracket, and fastener passages in the mounting bracket configured to accept fasteners that couple the mounting bracket to mounting hardware for the processor, wherein the fasteners, when coupled to the mounting hardware for the processor, cause the mounting bracket to exert a compressive force on the flanges of the heat exchanger. The fastener passages in the mounting bracket are positioned and sized to complement a corresponding fastener layout of the mounting hardware for the processor.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, a heat exchanger, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control. Computer systems as described herein may be mounted in racks included in a data center in some embodiments.

Processors, such as central processing units (CPUs), graphics processing units (GPUs), application specific integrated circuits (ASICs), field programmable gate arrays (FPGAs), etc. generate a considerable amount of waste heat and may be coupled with a heat exchanger, such as a heat sink or cold plate, to remove waste heat from the processors. Commonly such heat exchangers and processors are designed as a matched pair having matching dimensions and matching fastener patterns, wherein holes for the fasteners are formed in the body of the heat exchanger such that the heat exchanger is a single integral component that also includes fastener holes for mounting the heat exchanger to a matching processor. However, in such an approach wherein the heat exchanger is customized to a particular processor, the heat exchanger is restricted to being used only with the given type of processor and cannot be used with other processors having other dimensions or other fastener layouts. Moreover, the heat exchanger may not be used with other processors having similar thermal dissipation requirements or thermal performance requirements, because the integral mounting arrangement built into the heat exchanger precludes it from being mounted to other processors other than the specific processor for which it was designed to be mounted with, e.g. it's matching processor.

Some operators of computing facilities may manage computer systems comprising multiple different types, sizes, designs, etc. of processors. Additionally, many of these processors may have similar thermal dissipation requirements or thermal performance requirements. However, use of processor specific heat exchanger designs may require such operators to maintain inventories of unique heat exchangers for each different type of processor used in a fleet of computer systems managed by the operator. Maintaining such an inventory may be costly and inefficient.

In some embodiments, in order to improve efficiency and cost, a commonly designed heat exchanger that de-couples the details of the mounting arrangement from the heat exchanger itself may be used. For example, instead of having to maintain an inventory of various different types of heat processor-specific heat exchangers, one for each different type of processor in the facility operator's fleet, the facility operator may instead maintain a single or limited variety of common heat exchangers and additionally maintain an inventory of separate mounting brackets, wherein the inventory of mounting brackets includes various different types of mounting bracket that complement the different types of processors in the facility operator's fleet, but that are all configured to engage with flanges of the common heat exchanger. Maintaining different types of mounting brackets and a common heat exchanger design may be more cost efficient for the fleet operator than maintaining processor-specific heat exchangers with integral mounting structures. Also, facility reliability may further be improved, because inventory shortages may be avoided due to the flexibility of being able to use a fungible heat exchanger in any of a plurality of different configurations with different types of processors.

FIG. 1 is an exploded perspective viewing showing different upper mounting brackets that may be used to couple a common heat exchanger design, such as a common heat sink, to different types of processors that have different mounting hardware, according to some embodiments.

In some embodiments, a commonly designed heat exchanger configured to couple with a separate mounting structure, may include flanges configured to engage with various configurations of mounting structures. For example, heat exchanger 106, which is illustrated in FIG. 1 as a finned heat sink, includes lateral flanges 102 and front/back flanges 104 that extend outwards from a main body of the heat exchanger 106. The flanges 102 and 104 extend out a sufficient distance such that the flanges overlap with different mounting structures (e.g. mounting brackets 108, 110, 112, etc.) having different dimensions, when the mounting structures (e.g. mounting brackets 108, 110, 112, etc.) are placed around the fins of the heat exchanger 106.

For example, in some embodiments, a commonly designed heat exchanger may be mounted to a variety of processor configurations with different lengths and/or widths using complementary mounting brackets having different lengths and/or widths, such as lengths with differences spanning up to or over 15 millimeters between a longest and shortest length. In some embodiments, other length ranges may be supported. For example, in some embodiments a commonly designed heat exchanger may be configured to couple with processors having lengths from 105 millimeters to 120 millimeters. As another example, with regard to width, a commonly designed heat exchanger may be mounted to a variety of processor configurations with different widths using complementary mounting brackets having different widths, such as widths with differences spanning up to or over 15 millimeters between a longest and shortest width. In some embodiments, other width ranges may be supported. For example, in some embodiments a commonly designed heat exchanger may be configured to couple with processors having widths from 75 millimeters to 90 millimeters.

Note that in the above examples, various combinations of complementary mounting brackets may be used within the supported length and width ranges to mount the same commonly designed heat exchanger to a variety of different processors with different mounting hardware that match the complementary mounting brackets. Furthermore, the above dimensions are provided as examples, while in some embodiments other lengths, widths, length ranges, or width ranges, may be supported by a commonly designed heat exchanger. Also, in some embodiments, a complementary mounting bracket may be configured to couple a commonly designed heat exchanger to a processor with non-rectangular mounting hardware, such as a curved corner, square shape, non-symmetrical shape, etc. As long as the bolt hole pattern of the non-rectangular mounting hardware for a given processor falls within the envelope of widths and lengths supported by the commonly designed heat exchanger, custom mounting brackets may be used to mount the commonly designed heat exchanger to any processor type with non-rectangular mounting hardware.

The separate mounting structures, such as mounting brackets 108, 110, 112, etc., have dimensions and fastener layouts that complement different respective classes, types, or designs of processors. For example, mounting bracket 108 has width $W_1$ and length $L_1$, and also includes fasteners openings laid out according to bolt pattern $BP_1$. In a similar manner, processor 114 includes processing mounting hardware that has width $W_1$ and length $L_1$, and also includes fasteners openings laid out according to bolt pattern $BP_1$. Additionally, mounting bracket 110 has width $W_2$ and length $L_2$, and also includes fasteners openings laid out according to bolt pattern $BP_2$. In a similar manner, processor 116 includes processing mounting hardware that has width $W_2$ and length $L_2$, and also includes fasteners openings laid out according to bolt pattern $BP_2$. Likewise, mounting bracket 112 has width $W_N$ and length $L_N$, and also includes fasteners openings laid out according to bolt pattern $BP_N$. In a similar manner, processor 118 includes processing mounting hardware that has width $W_N$ and length $L_N$, and also includes fasteners openings laid out according to bolt pattern $BP_N$.

In some embodiments, the same heat exchanger 106 may be coupled to any of processors 114 and 116 through 118 using complementary mounting brackets 108 and 110 through 112, even though processors 114 and 116 through 118 have associated mounting hardware that have different widths, lengths, and fastener hole layouts. This is possible because flanges 102 extend out from heat exchanger 106 a distance greater than the largest width of widths $W_1$ through $W_N$. Also the fins or other vertical components extending up relative to the flanges 102 of heat exchanger 106 are confined within an inner dimension, such that a smallest with of the widths $W_1$ through $W_N$ is sufficiently large enough to fit around the fins or other vertical components such that the upper mounting brackets 108 through 112, having different widths, all fit around the fins and other vertical components of heat exchanger 106. Additionally the upper mounting brackets 108 through 112 do not extend beyond the outer limits of the flanges 102, such that any of the upper mounting brackets 108 through 112 engage flanges 102 when used to mount heat exchanger 106 to a processor having processor mounting hardware that complements a selected one of the upper mounting brackets 108 through 112. In a similar manner flanges 104 extend out in front of, and behind, the body of heat exchanger 106 such that any of the upper mounting brackets 108 through 112 having lengths $L_1$ through $L_N$ fit around the fins of the heat exchanger and engage flanges 104 when being coupled to a complementary piece of processor mounting hardware.

Also, in some embodiments, heat exchanger 106 and flanges 102 and 104 may be configured to have open corners that accommodate various fastener layouts that may be used in processor mounting hardware. Additionally, as shown in FIG. 1, in some embodiments, flanges 102 and 104 may further have center openings to accommodate fastener passages. For example, the open corners of flanges 104/104 of heat exchanger 106 may allow for fasteners to pass between upper mounting brackets 108 or 112 down to processor mounting hardware for processors 114 or 118 without interfering with the fasteners. Likewise, in some embodiments, heat exchanger 106 may include center openings in the flanges 102 and 104 that enable fasteners to pass between upper bracket 110 and mounting hardware for processor 116 that follow bolt-hole pattern $BP_2$. While other ones of the heat exchangers and flanges are shown herein with different flange layouts that do not necessarily include center openings, in some embodiments, such center openings may be included in the various other embodiments.

In some embodiments, processors 114, 116, and 118 may be processors designed, manufactured, or both, by different entities, such as different processor suppliers. Also, in some embodiments, processors 114, 116, and 118 may be processors designed, manufactured, or both by a same entity, but reflecting different models or generations of processors manufactured or designed by the given entity. In some embodiments, processors 114, 116, and 118 may generate waste heat within a range within which heat exchanger 106 can remove the waste heat. For example, in some embodiments, processors 114, 116, and 118 may generate as little as 200 watts or less of waste heat or as much as approximately 450 watts of waste heat. Though in some embodiments, a heat exchanger 106 may be designed to facilitate removal of various other quantities of waste heat at various other rates. Additionally, in some embodiments, air flow over heat exchanger 106 (or coolant flow in the case of a cold plate version of heat exchanger 106) may be adjusted to further calibrate heat removal via heat exchanger 106 to requirements of a processor with which heat exchanger 106 is coupled.

Figure 2:
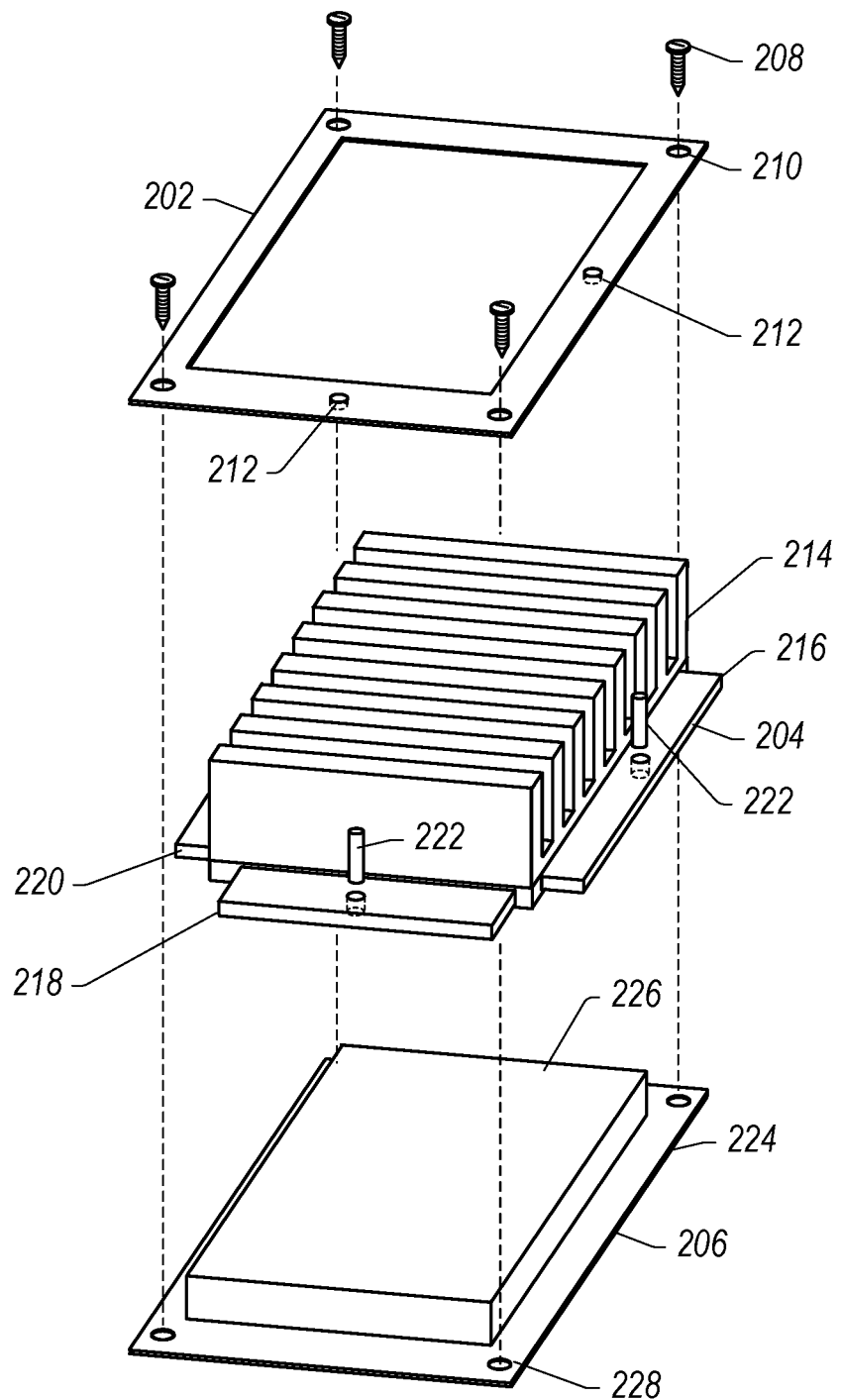
FIG. 2 is a more detailed exploded view showing an upper mounting bracket that complements mounting hardware of a particular type of processor and that is used to couple a separate heat sink to the particular type of processor, wherein the heat sink has a common design that enables it to be coupled with the particular type of processor and other types of processors, according to some embodiments.
Figure 10:
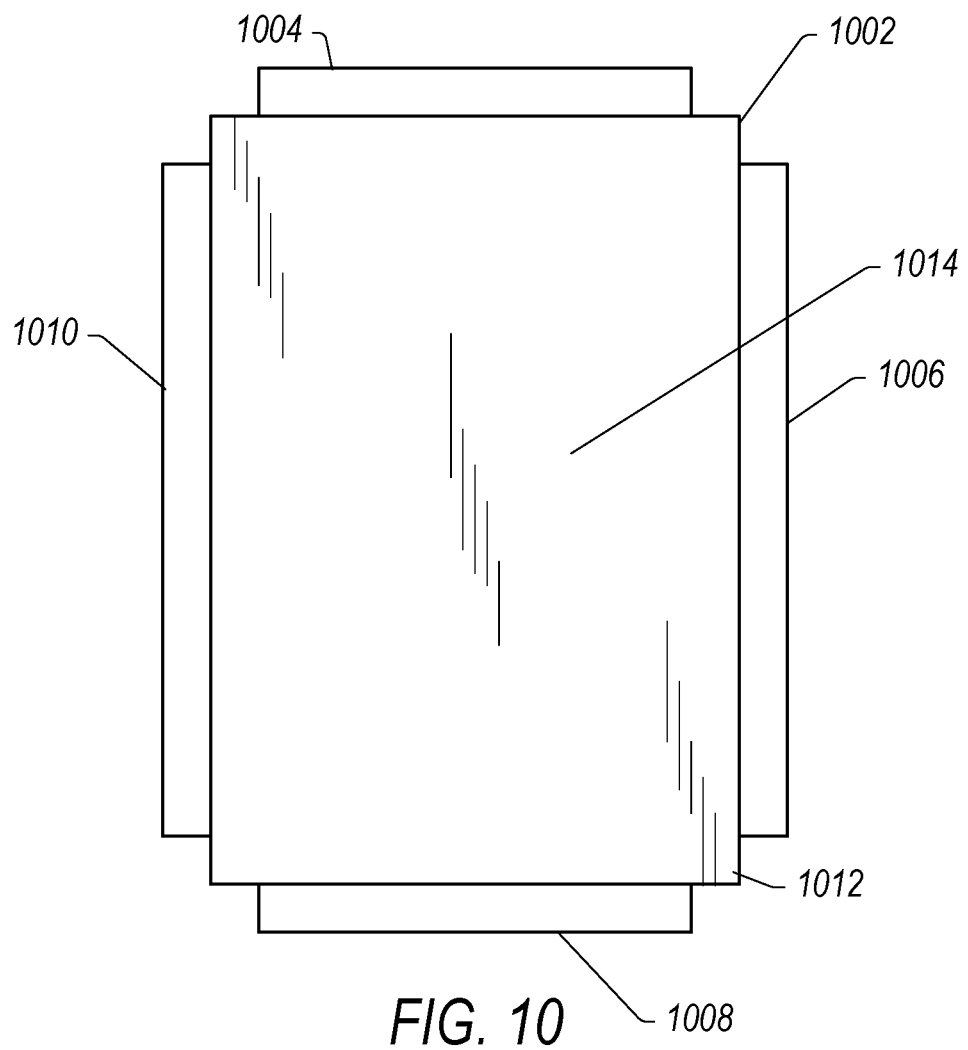
FIG. 10 is a bottom view of a commonly designed heat sink configured to be mounted to a processor using a separate mounting bracket, according to some embodiments.

Also, as further shown in FIG. 10, heat exchanger 106 may have a bottom surface 1014 that has a large enough contact area to cover various surface areas of processor packages with different dimensions. Also, fasteners, such as fasteners 208 as shown in FIG. 2 may have a length or may be selected with different lengths to accommodate coupling to different processor packages having different heights. In some embodiments, a heat spreader, such as a vapor chamber heat spreader or heat pipe may be inserted between a top of a processor package and a heat exchanger, such as heat exchanger 106. For example, if a processor package has a smaller surface area than the heat exchanger 106, a heat spreader may spread the heat from the smaller processor package to the larger area of the heat exchanger 106. In such embodiments, fasteners 208 may be of a sufficient length to accommodate the heat spreader included in the stack.

In some embodiments, processors 114, 116, 118 may be different classes of processors, such as central processing units (CPUs), graphics processing units (GPUs), application specific integrated circuits (ASICs), field programmable gate arrays (FPGAs), etc. Also, in some embodiments, processors 114, 116, 118 may be different types of processors within a given class, such as different sized CPUs, GPUs, ASICs, FPGAs, etc. Also, in some embodiments, processors 114, 116, 118 may have similar (or different) performance characteristics, but may be different designs or processors manufactured or designed by different processor suppliers.

As further shown in FIGS. 4-6, in some embodiments, processors 114, 116, 118 may be mounted on a printed circuit board, such as a motherboard of a computer system. Also, as further shown in FIGS. 4-6 mounting hardware for processors 114, 116, 118 may include mounting hardware both above and below the printed circuit board (PCB). In some embodiments, processors 114, 116, 118 may mount in a socket of its associated mounting hardware and/or may be connected to a PCB via soldered connections.

FIG. 2 is a more detailed exploded view showing an upper mounting bracket that complements mounting hardware of a particular type of processor and that is used to couple a separate heat sink to the particular type of processor, wherein the heat sink has a common design that enables it to be coupled with the particular type of processor and other types of processors, according to some embodiments.

In some embodiments, any of the mounting brackets shown in FIG. 1 and any of the complementary processor mounting hardware shown in FIG. 1 may be coupled together to mount a heat exchanger 106 to a given processor using fasteners as shown in FIG. 2.

Upper mounting bracket 202 may be made of various materials, such as machined aluminum or stamped steel, and may include fastener openings 210 laid out according to a bolt pattern that matches a bolt pattern of processor 206. Additionally, in some embodiments, upper mounting bracket 202 may include anti-tilt holes 212 configured to accept anti-tilt pins 222 of heat exchanger 204. In some embodiments, anti-tilt holes 212 may have a diameter that matches a diameter of the anti-tilt pins 222 with a small additional tolerance, such as 0.01 millimeters of additional diameter.

Heat exchanger 204 may be a convection cooled heat sink comprising fins 214 and may include flanges 216, 218, and 220 extending out from a central body of heat exchanger 204. Additionally, heat exchanger 204 may include anti-tilt pins 222 that are mounted on perpendicularly oriented flanges, such as flanges 216 and 218. The perpendicularly mounted anti-tilt pins may restrict rotation of heat exchanger 204 about the X and Y axis relative to upper mounting bracket 202, when the anti-tilt pins 222 are inserted into anti-tilt holes 212 of upper mounting bracket 202.

Fasteners 208 may pass through fastener openings 210 of upper mounting bracket 202 and may engage with bolts or other types of fasteners of processor hardware for processor 206. For example, mounting hardware 224 may surround processor package 226 and may include fastener openings/ fastener connectors 228 configured to engage with fasteners 208 to couple heat exchanger 202 to a top surface of processor package 226 via upper mounting bracket 202. In some embodiments, fasteners 208 when fastened to mounting hardware 224 of processor 206 may cause upper mounting bracket 202 to exert a compressive force down onto the flanges 216, 218, and 220 of heat exchanger 204, which may in turn push a bottom flat surface of heat exchanger 204 against an upper surface of processor package 226, thus securing heat exchanger 204 to processor 206. In some embodiments, a thermal interface material (TIM) may be included between the bottom surface of heat exchanger 204 and the top surface of processor package 226 to improve thermal conductivity.

Figure 3:
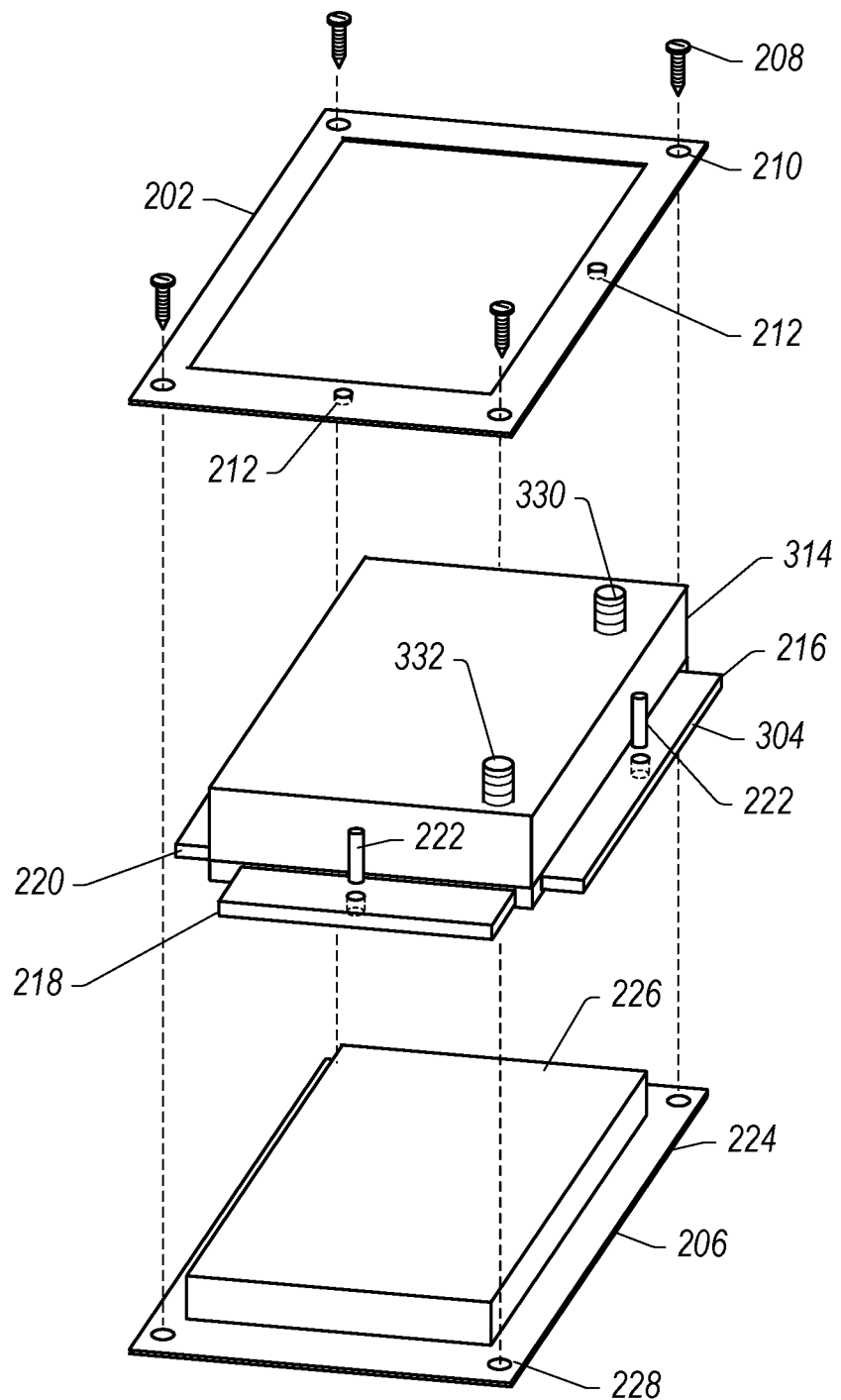
FIG. 3 is an exploded view showing an upper mounting bracket that complements mounting hardware of a particular type of processor and that is used to couple a separate cold plate to the particular type of processor, wherein the cold plate has a common design that enables it to be coupled with the particular type of processor and other types of processors, according to some embodiments.

FIG. 3 is an exploded view showing an upper mounting bracket that complements mounting hardware of a particular type of processor and that is used to couple a separate cold plate to the particular type of processor, wherein the cold plate has a common design that enables it to be coupled with the particular type of processor and other types of processors, according to some embodiments.

FIG. 3 illustrates a similar arrangement as shown in FIG. 2, but heat exchanger 304 is a cold-plate instead of a heat sink as illustrated in FIG. 2. For example, instead of including fins 214, heat exchanger 304 includes cold-plate body 314 and inlet and outlet connections 330 and 332 for connecting cold plate 304 to a coolant source and coolant return. Cold-plate heat exchanger 304 may cool processor 206 via a coolant that circulates through internal passages of cold-plate body 314, for example using similar passages as passages 1108 shown in FIG. 11. In some embodiments, the coolant circulated through cold-plate 304 may be a liquid, such as chilled water, or may be an expanding liquid/vapor such as compressed refrigerant. In some embodiments, cold-plate body 314 may include a vapor chamber heat spreader or heat pipe and a brazed copper cooling block coupled to the vaper chamber heat spreader or heat pipe.

Figure 4A:
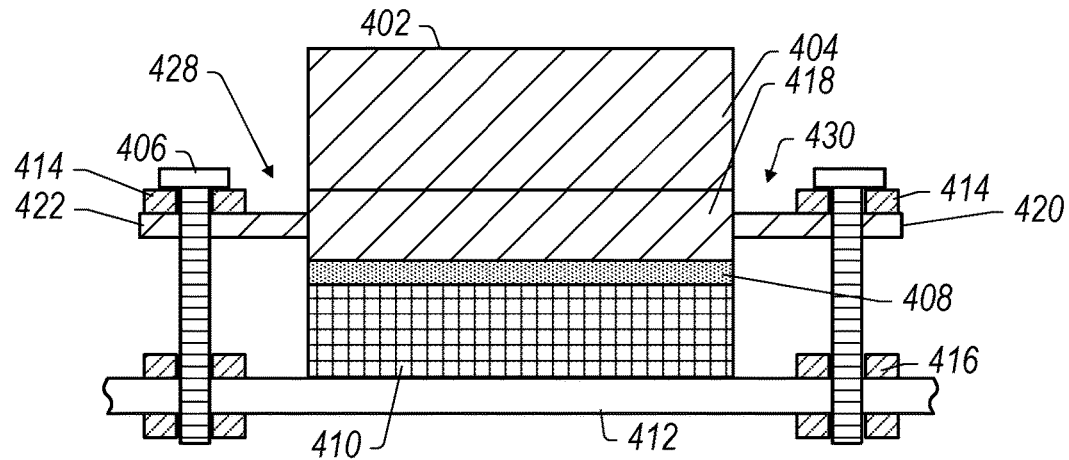
FIG. 4A is a front view of a cross-section of a processor assembly comprising a common heat sink mounted on a processor using a mounting bracket that compliments mounting hardware of the processor having dimensions $W_1$ and $L_1$ and configured using bolt pattern $BP_1$, according to some embodiment.

FIG. 4A is a front view of a cross-section of a processor assembly comprising a common heat sink mounted on a processor using a mounting bracket that compliments mounting hardware of the processor having dimensions $W_1$ and $L_1$ and configured using bolt pattern $BP_1$, according to some embodiment.

In some embodiments, any of the mounting brackets as shown in FIGS. 1-3 and any of the heat exchangers as shown in FIGS. 1-3 may be assembled in a similar arrangement as shown in FIGS. 4-6.

Heat exchanger 402 includes a base portion 418 and a heat rejection portion 404 (e.g. fins or pins of heat sink). In some embodiments, heat exchanger 402 may be a cold-plate in which case heat rejection portion 404 may take the form of cooling passages within base portion 418. Heat exchanger 404 also includes side flanges, such as left-side flange 422 and right-side flange 420 extending out from base portion 418. Upper mounting bracket 414 engages with a top surface of flanges 420 and 422.

Thermal interface material 408 is positioned between a bottom surface of heat exchanger body 418 and a top surface of processor package 410. Also, processor package 410 is mounted on printed circuit board (PCB) 412 and includes associated mounting hardware 416, which may include a plate or other rigid structure above, below (or both) relative to PCB 412. Fasteners 406 engage with mounting hardware 416 and are tightened such that the fasteners exert a compressive force on upper mounting bracket 414, which in turn exerts a compressive force on flanges 420 and 422, which then pushes heat exchanger body 418 downward and compresses TIM 408 and exerts a compressive force against processor package 410.

In some embodiments, fasteners 406 may be precisely tightened to exert a compressive force on processor package 410 with a force in a range specified by a manufacturer of processor package 410. Also, in some embodiments, spring screws or other types of fasteners may be used to ensure an appropriate compressive force is exerted on processor package 410 without applying excessive force.

Figure 4B:
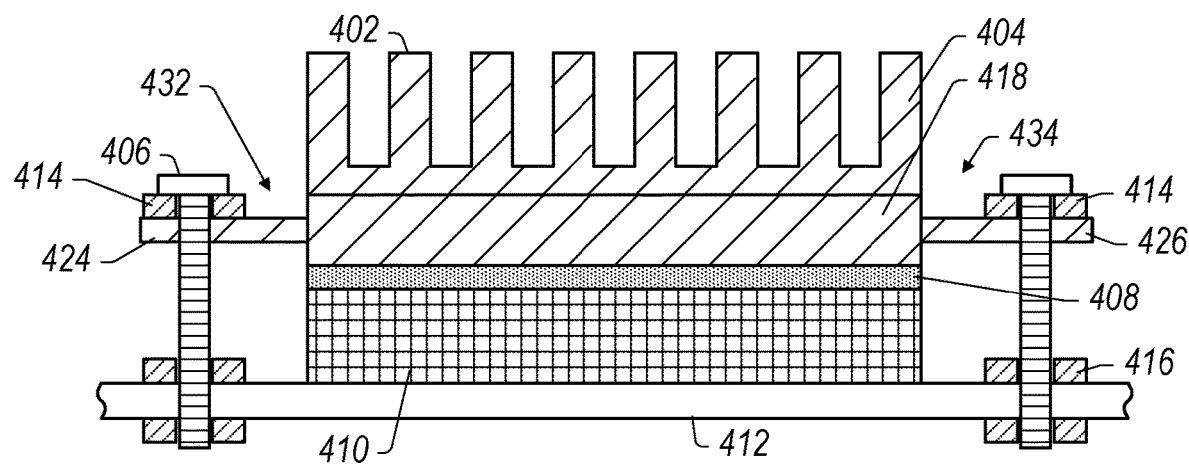
FIG. 4B is a side view of a cross-section of a processor assembly comprising the common heat sink mounted on a processor using a mounting bracket that compliments mounting hardware of the processor having dimensions $W_1$ and $L_1$ and configured using bolt pattern $BP_1$, according to some embodiment.

FIG. 4B is a side view of a cross-section of a processor assembly comprising the common heat sink mounted on a processor using a mounting bracket that compliments mounting hardware of the processor having dimensions $W_1$ and $L_1$ and configured using bolt pattern $BP_1$, according to some embodiment.

In the side view shown in FIG. 4B, front flange 424 and back flange 426 are also shown extending out from body portion 418 of heat exchanger 402.

While various dimensions of upper mounting bracket may be used, FIGS. 4A and 4B illustrate an example corresponding to upper mounting bracket 108 shown in FIG. 1 with dimensions $W_1$ and $L_1$. For example, $W_1$ and $L_1$ may be at an upper range of dimensions of mounting brackets with which heat exchanger 402 is configured to engage, such that mounting bracket 414 falls near an outer end of flanges 420, 422, 424, and 426. This may result in gaps 428, 430, 432, and 434 between upper mounting bracket 414 and body portion 418 of heat exchanger 404.

Figure 5A:
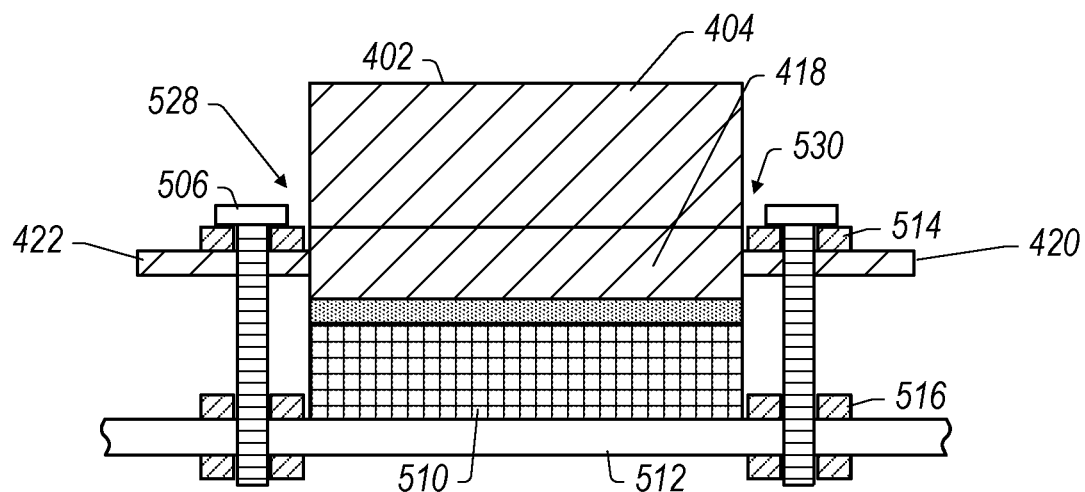
FIG. 5A is a front view of a cross-section of a processor assembly comprising the common heat sink (e.g. the same heat sink as in FIGS. 4A/4B) mounted on a processor using a mounting bracket that compliments mounting hardware of the processor having dimensions $W_2$ and $L_2$ and configured using bolt pattern $BP_2$, according to some embodiment.
Figure 5B:
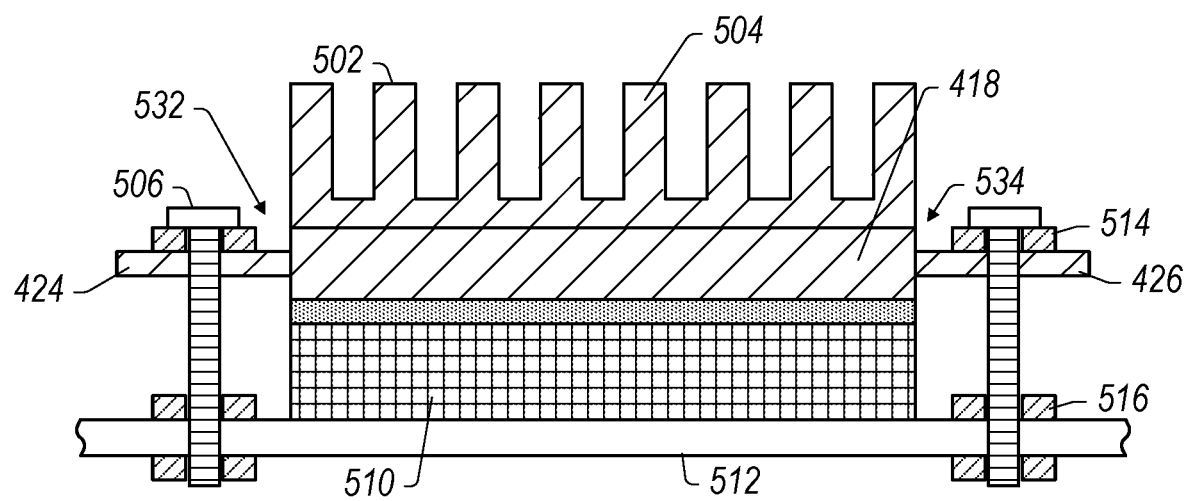
FIG. 5B is a side view of a cross-section of a processor assembly comprising the common heat sink (e.g. the same heat sink as in FIGS. 4A/4B) mounted on a processor using a mounting bracket that compliments mounting hardware of the processor having dimensions $W_2$ and $L_2$ and configured using bolt pattern $BP_2$, according to some embodiment.

FIG. 5A is a front view of a cross-section of a processor assembly comprising the common heat sink (e.g. the same heat sink as in FIGS. 4A/4B) mounted on a processor using a mounting bracket that compliments mounting hardware of the processor having dimensions $W_2$ and $L_2$ and configured using bolt pattern $BP_2$, according to some embodiment. FIG. 5B is a side view of a cross-section of a processor assembly comprising the common heat sink (e.g. the same heat sink as in FIGS. 4A/4B) mounted on a processor using a mounting bracket that compliments mounting hardware of the processor having dimensions $W_2$ and $L_2$ and configured using bolt pattern $BP_2$, according to some embodiment.

FIGS. 5A/5B may correspond to an assembly using upper mounting bracket 110 as shown in FIG. 1 having dimensions $W_2$ and $L_2$. For example, $W_2$ may be at a lower end of widths of mounting brackets with which heat exchanger 402 is configured to engage.

For example, upper mounting bracket 514 may have a more narrow width than upper mounting bracket 414. Thus, gaps 528 and 530 between body portion 418 of heat exchanger 402 and upper mounting bracket 514 may be narrower. Additionally, the width of upper mounting bracket 514 may match or complement a width of mounting hardware 516 associated with processor package 510 mounted on PCB 512. Additionally, fasteners 506 may be a same or complementary fastener type that matches or complements mounting hardware 516 associated with processor package 510.

As another example, upper mounting bracket 514 may have a mid-range or slightly shorter length than mounting bracket 414. Thus, gaps 532 and 534 may be narrower than gaps 432 and 434, but not as tight as gaps 528 and 530.

Figure 6A:
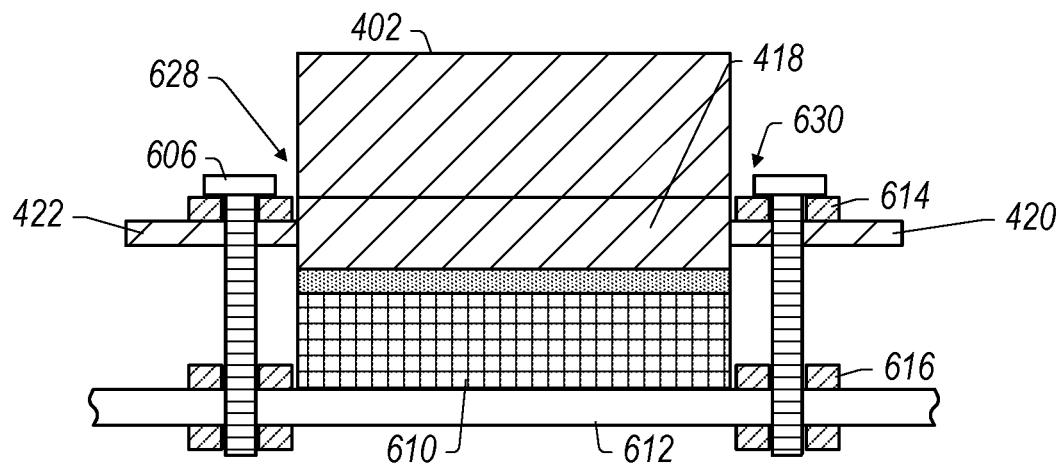
FIG. 6A is a front view of a cross-section of a processor assembly comprising the common heat sink (e.g. the same heat sink as in FIGS. 4A/4B) mounted on a processor using a mounting bracket that compliments mounting hardware of the processor having dimensions $W_N$ and $L_N$ and configured using bolt pattern $BP_N$, according to some embodiment.

FIG. 6A is a front view of a cross-section of a processor assembly comprising the common heat sink (e.g. the same heat sink as in FIGS. 4A/4B) mounted on a processor using a mounting bracket that compliments mounting hardware of the processor having dimensions $W_N$ and $L_N$ and configured using bolt pattern $BP_N$, according to some embodiment.

Figure 6B:
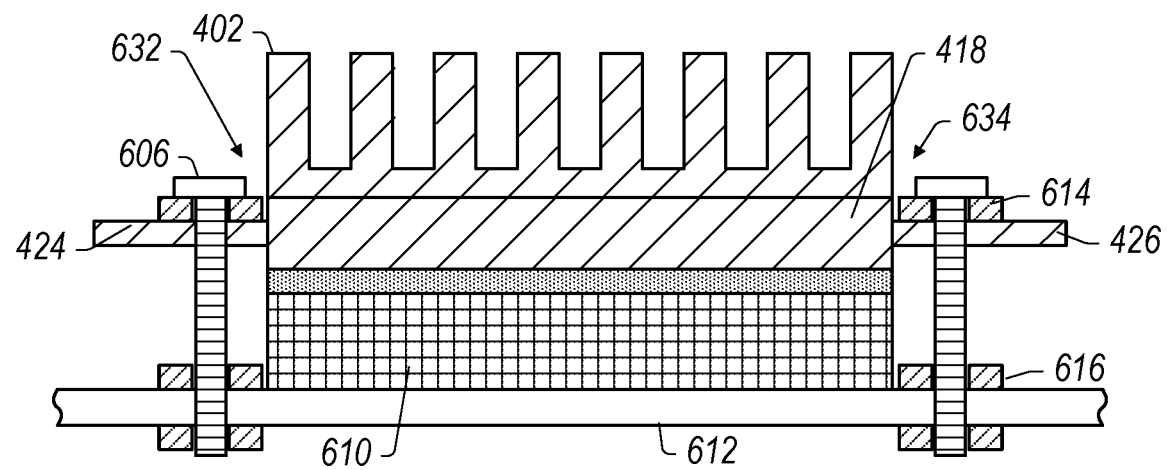
FIG. 6B is a side view of a cross-section of a processor assembly comprising the common heat sink (e.g. the same heat sink as in FIGS. 4A/4B) mounted on a processor using a mounting bracket that compliments mounting hardware of the processor having dimensions $W_N$ and $L_N$ and configured using bolt pattern $BP_N$, according to some embodiment.

FIG. 6B is a side view of a cross-section of a processor assembly comprising the common heat sink (e.g. the same heat sink as in FIGS. 4A/4B) mounted on a processor using a mounting bracket that compliments mounting hardware of the processor having dimensions $W_N$ and $L_N$ and configured using bolt pattern $BP_N$, according to some embodiment.

FIGS. 6A/6B may correspond to an assembly using upper mounting bracket 112 as shown in FIG. 1 having dimensions $W_N$ and $L_N$. For example, $W_N$ may be at a lower end of widths of mounting brackets with which heat exchanger 402 is configured to engage. Also, $L_N$ may be at a lower end of lengths of mounting brackets with which heat exchanger 402 is configured to engage For example, upper mounting bracket 614 may have a more narrow width than upper mounting bracket 414. Thus, gaps 628 and 630 between body portion 418 of heat exchanger 402 and upper mounting bracket 614 may be narrower than gaps 428 and 630 and similar to gaps 528 and 530. Additionally, the width of upper mounting bracket 614 may match or complement a width of mounting hardware 616 associated with processor package 610 mounted on PCB 612. Additionally, fasteners 606 may be a same or complementary fastener type that matches or complements mounting hardware 616 associated with processor package 610.

As another example, upper mounting bracket 614 may have a shorter length than mounting bracket 414 and 514. Thus, gaps 632 and 634 may be narrower and similar to gaps 628 and 630.

As can be seen the lengths to which flanges 420, 422, 424, and 426 extend out from body portion 418 may enable heat exchanger 402 to be used with various types/sizes of processors using various different mounting brackets that complement the sizes and types of processors.

Figure 7:
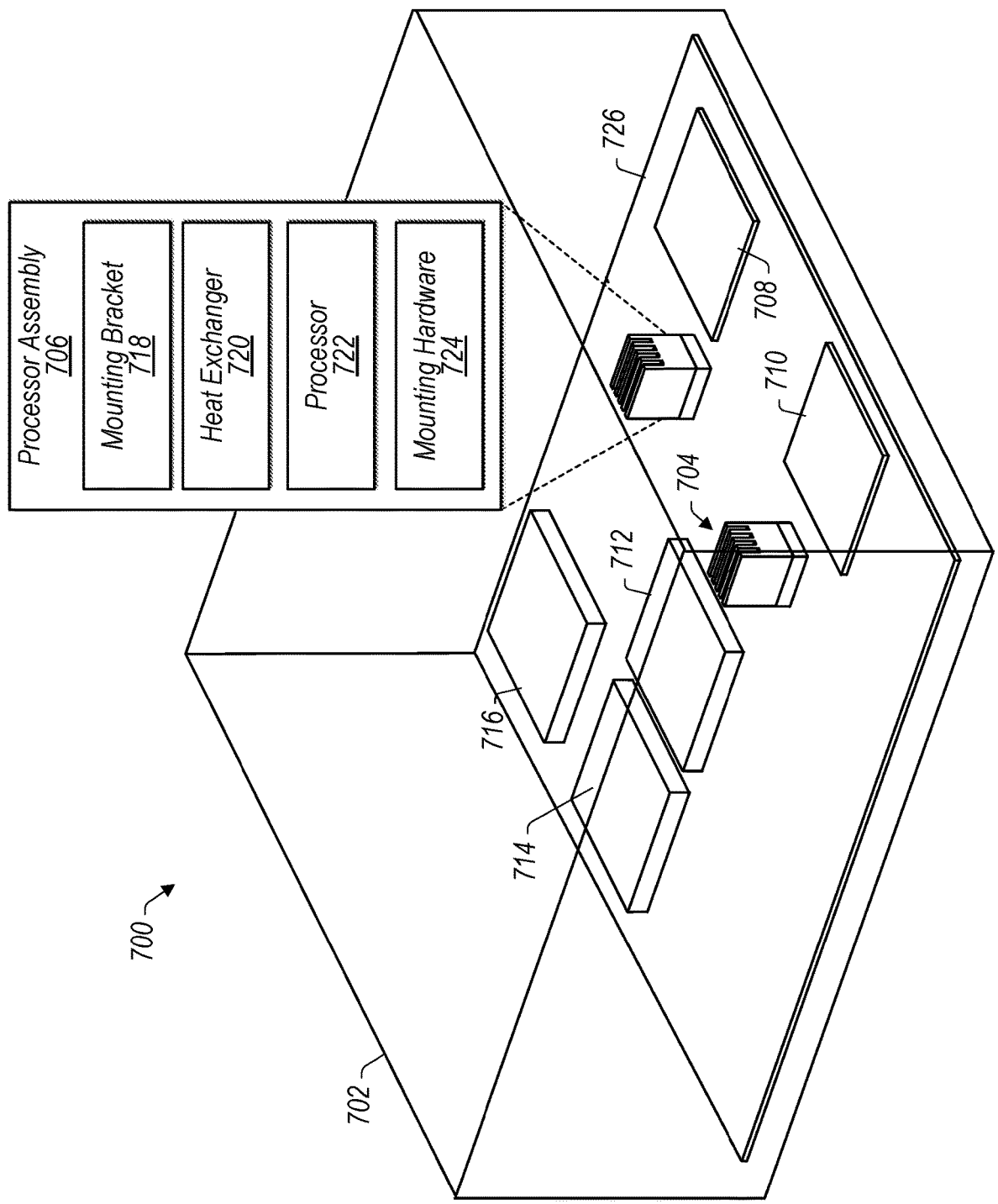
FIG. 7 is a perspective view of a computer system that comprises a processor assembly that includes a commonly designed heat sink mounted on a processor using a separate mounting bracket that compliments mounting hardware of the processor, according to some embodiments.

FIG. 7 is a perspective view of a computer system that comprises a processor assembly that includes a commonly designed heat sink mounted on a processor using a separate mounting bracket that compliments mounting hardware of the processor, according to some embodiments.

In some embodiments, any of the heat exchangers, processors, and mounting brackets described herein may be included in a computer system, such as computer system 700.

For example, processor assemblies 704 and 706 are included in chassis 702 of computer system 700 and are mounted on printed circuit board 726. In some embodiments, any of the heat exchangers and mounting brackets described herein may be included in processor assemblies 704 and 706. For example, processor assembly 706 includes processor mounting hardware 724, a processor 722, a heat exchanger 720 coupled to the processor 722, and a mounting bracket 718 that mounts heat exchanger 720 to processor 722 via fasteners engaged with processor mounting hardware 724.

In some embodiments, other computing components may be mounted on printed circuit board 726 in addition to processor assemblies 704 and 706. For example, computer system 700 also includes mass storage devices 712, 714, and 716, which may be hard disk drives, solid state drives, etc. Additionally, computer system 700 includes memory devices 708 and 710 coupled to printed circuit board 726.

Figure 8A:
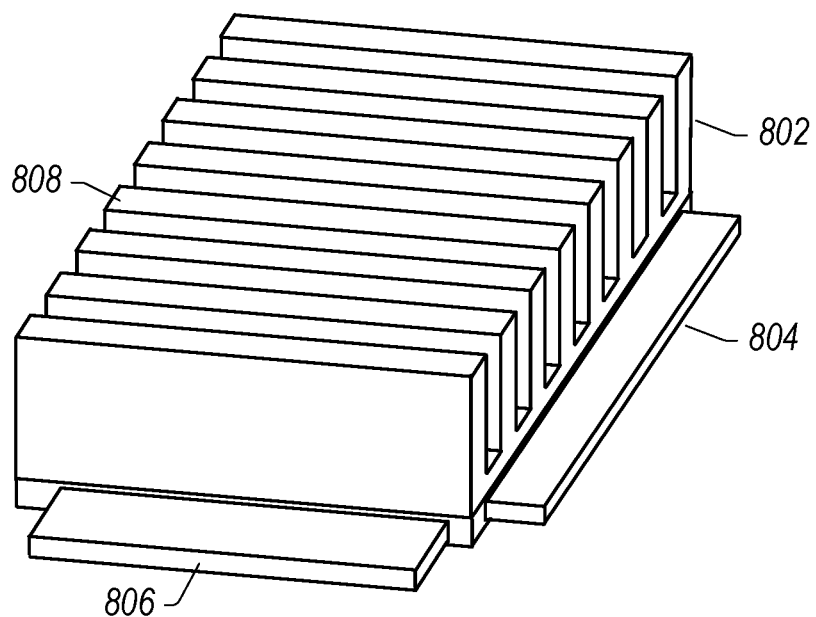
FIG. 8A is a perspective view of a commonly designed heat sink configured to be mounted to a processor using a separate mounting bracket, wherein the heat sink includes fins, according to some embodiments.

FIG. 8A is a perspective view of a commonly designed heat sink configured to be mounted to a processor using a separate mounting bracket, wherein the heat sink includes fins, according to some embodiments.

In some embodiments, a commonly designed heat exchanger may take the form of a heat sink with fins and flanges. For example, heat sink 802 includes fins 808 and flanges 804 and 806.

Figure 8B:
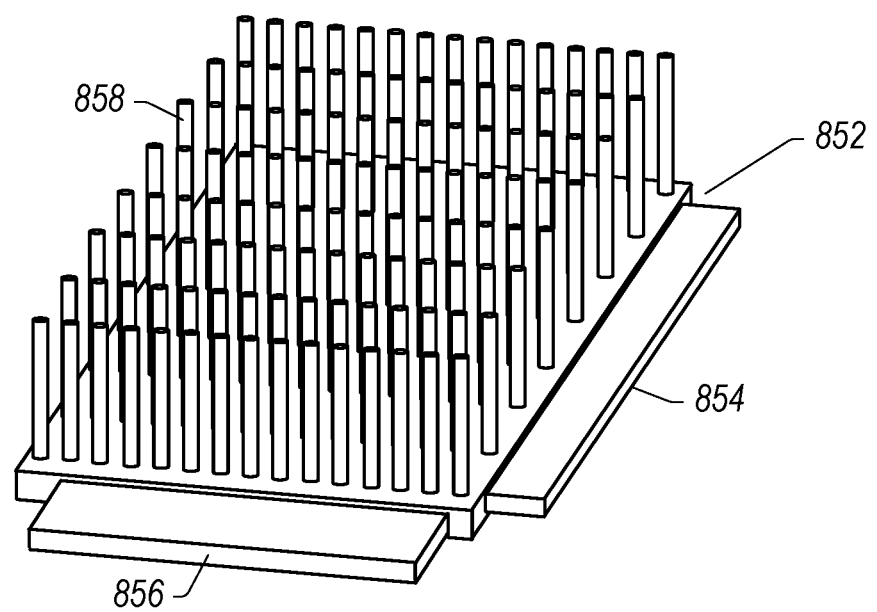
FIG. 8B is a perspective view of a commonly designed heat sink configured to be mounted to a processor using a separate mounting bracket, wherein the heat sink includes pins, according to some embodiments.

FIG. 8B is a perspective view of a commonly designed heat sink configured to be mounted to a processor using a separate mounting bracket, wherein the heat sink includes pins, according to some embodiments.

In some embodiments, a commonly designed heat exchanger may take the form of a heat sink with pins and flanges. For example, heat sink 852 includes pins 858 and flanges 854 and 856.

Figure 9:
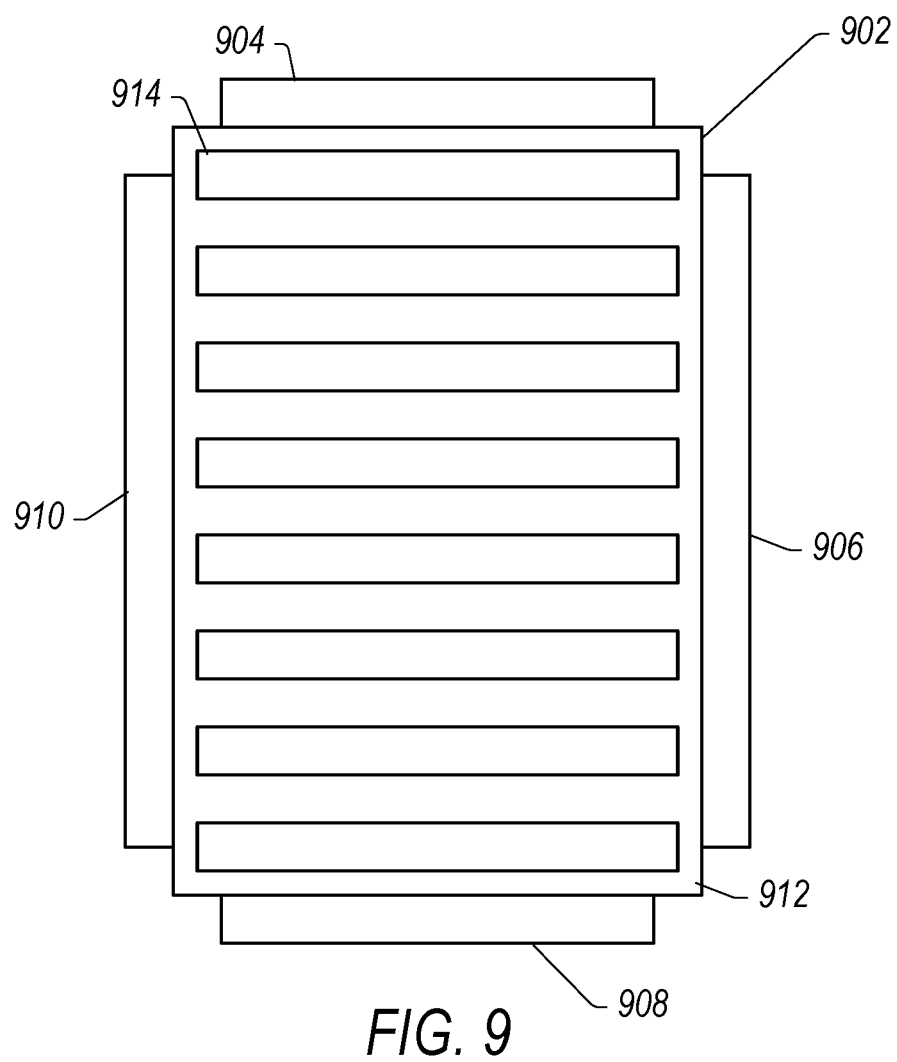
FIG. 9 is a top view of a commonly designed heat sink configured to be mounted to a processor using a separate mounting bracket, according to some embodiments.

FIG. 9 is a top view of a commonly designed heat sink configured to be mounted to a processor using a separate mounting bracket, according to some embodiments.

In some embodiments, a commonly designed heat exchanger, such as heat sink 902, may include a heat transfer portion, such as fins 914, a body portion, such as body 912, and flanges extending out from the body portion on a plurality of sides of the heat exchanger. For example, heat sink 902 includes lateral flanges 906 and 910 extending out from lateral sides of body 912. Additionally, heat sink 902 includes front and back flanges 904 and 908 extending out from body 912.

FIG. 10 is a bottom view of a commonly designed heat sink configured to be mounted to a processor using a separate mounting bracket, according to some embodiments.

In some embodiments, any of the heat exchangers described herein may have a flat bottom surface configured to mount on a top surface of a processor package and/or compress a thermal interface material against a top surface of the processor package. For example, heat exchanger 1002 includes flanges 1004, 1006, 1008, and 1010 extending out from body portion 1012 and also includes flat bottom surface 1014.

Figure 11:
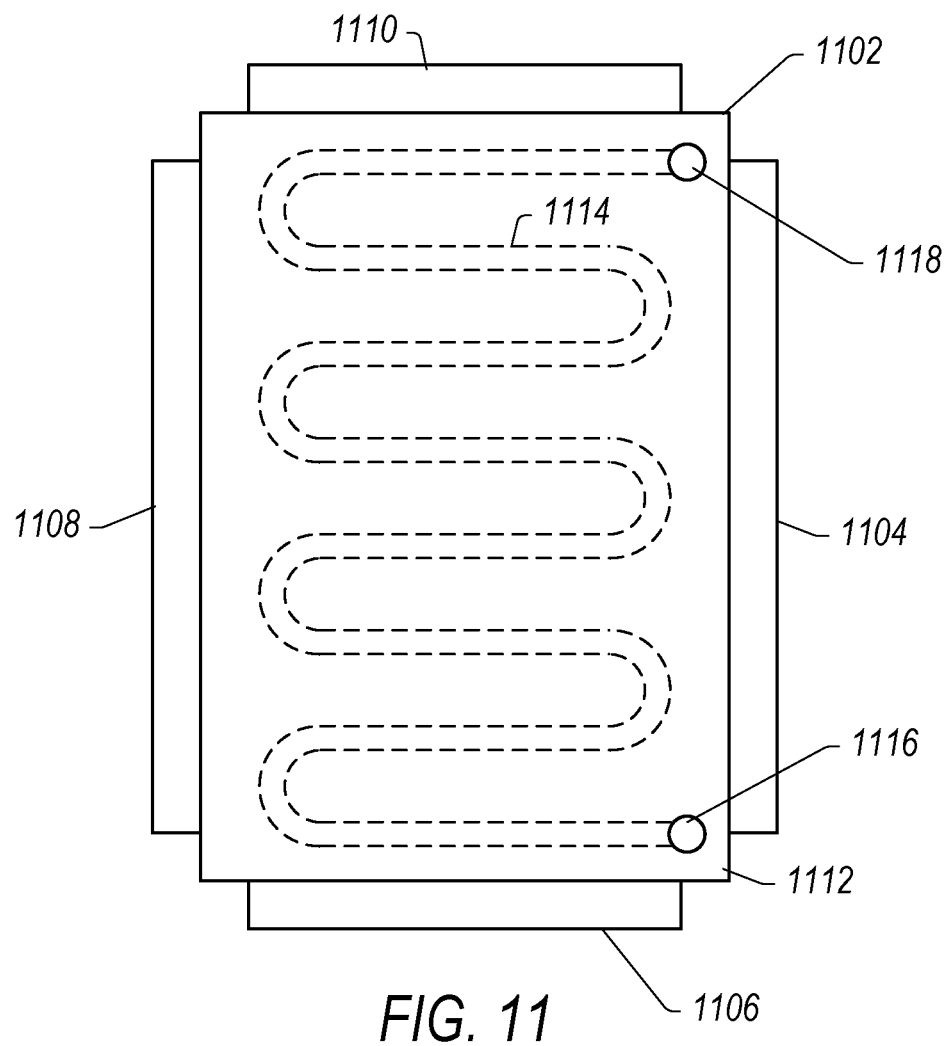
FIG. 11 is a top view of a commonly designed cold-plate configured to be mounted to a processor using a separate mounting bracket, according to some embodiments.

FIG. 11 is a top view of a commonly designed cold-plate configured to be mounted to a processor using a separate mounting bracket, according to some embodiments.

In some embodiments, a heat exchanger, such as heat exchanger 1002 may include fins or pins, such as shown in FIGS. 8-9 or may include cooling passages of a cold-plate as shown in FIG. 11.

For example, cold plate 1102 includes flanges 1104, 1106, 1108, and 1110 extending out from body 1112. Additionally, body 1112 includes cooling fluid passages 1114 and inlet and outlet connections 1116 and 1118.

Figure 12A:
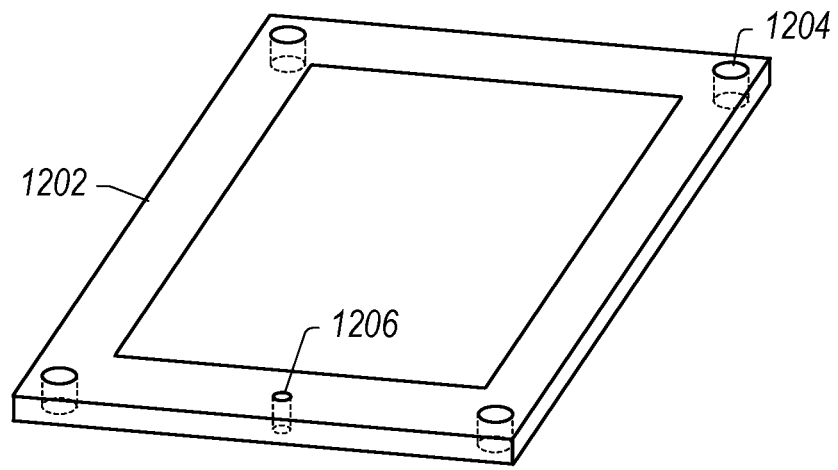
FIG. 12A is a perspective view of an upper mounting bracket that compliments mounting hardware for a particular type of processor and which may be used to couple a commonly designed heat exchanger to the particular type of processor, wherein the mounting bracket includes a hole configured to accept an anti-tilt pin of the commonly designed heat exchanger, according to some embodiments.

FIG. 12A is a perspective view of an upper mounting bracket that compliments mounting hardware for a particular type of processor and which may be used to couple a commonly designed heat exchanger to the particular type of processor, wherein the mounting bracket includes a hole configured to accept an anti-tilt pin of the commonly designed heat exchanger, according to some embodiments.

In some embodiments, an upper mounting bracket, such as upper mounting bracket 1202 may include fastener openings 1204 and an anti-tilt hole 1206.

Figure 12B:
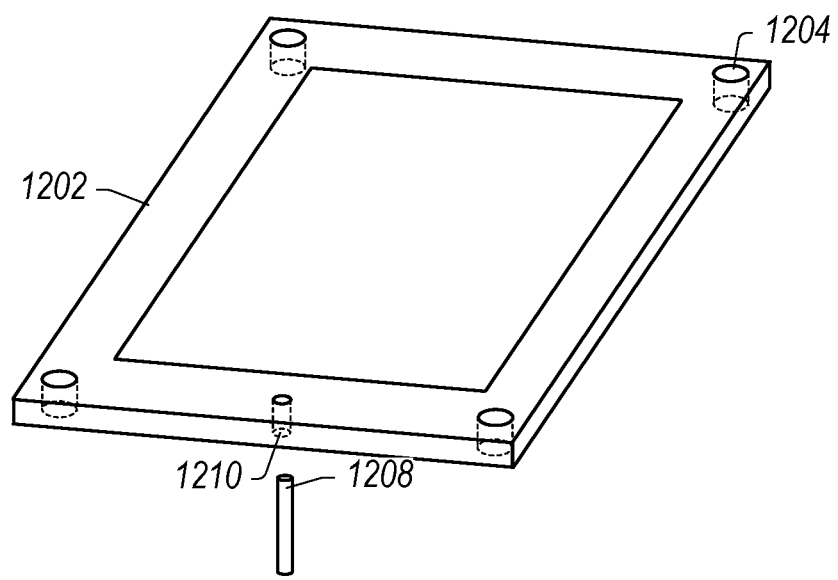
FIG. 12B is a perspective view of an upper mounting bracket that compliments mounting hardware for a particular type of processor and which may be used to couple a commonly designed heat exchanger to the particular type of processor, wherein the mounting bracket includes an anti-tilt pin configured to be inserted into a hole of the commonly designed heat exchanger, according to some embodiments.

FIG. 12B is a perspective view of an upper mounting bracket that compliments mounting hardware for a particular type of processor and which may be used to couple a commonly designed heat exchanger to the particular type of processor, wherein the mounting bracket includes an anti-tilt pin configured to be inserted into a hole of the commonly designed heat exchanger, according to some embodiments.

In some embodiments, an upper mounting bracket, such as upper mounting bracket 1202 may include fastener openings 1204 and an anti-tilt pin 1208, wherein the anti-tilt pin 1208 fits into a mounting hole 1210 and is configured to be inserted into a corresponding anti-tilt hole of a heat exchanger with which upper mounting bracket 1202 mounts.

Figure 13:
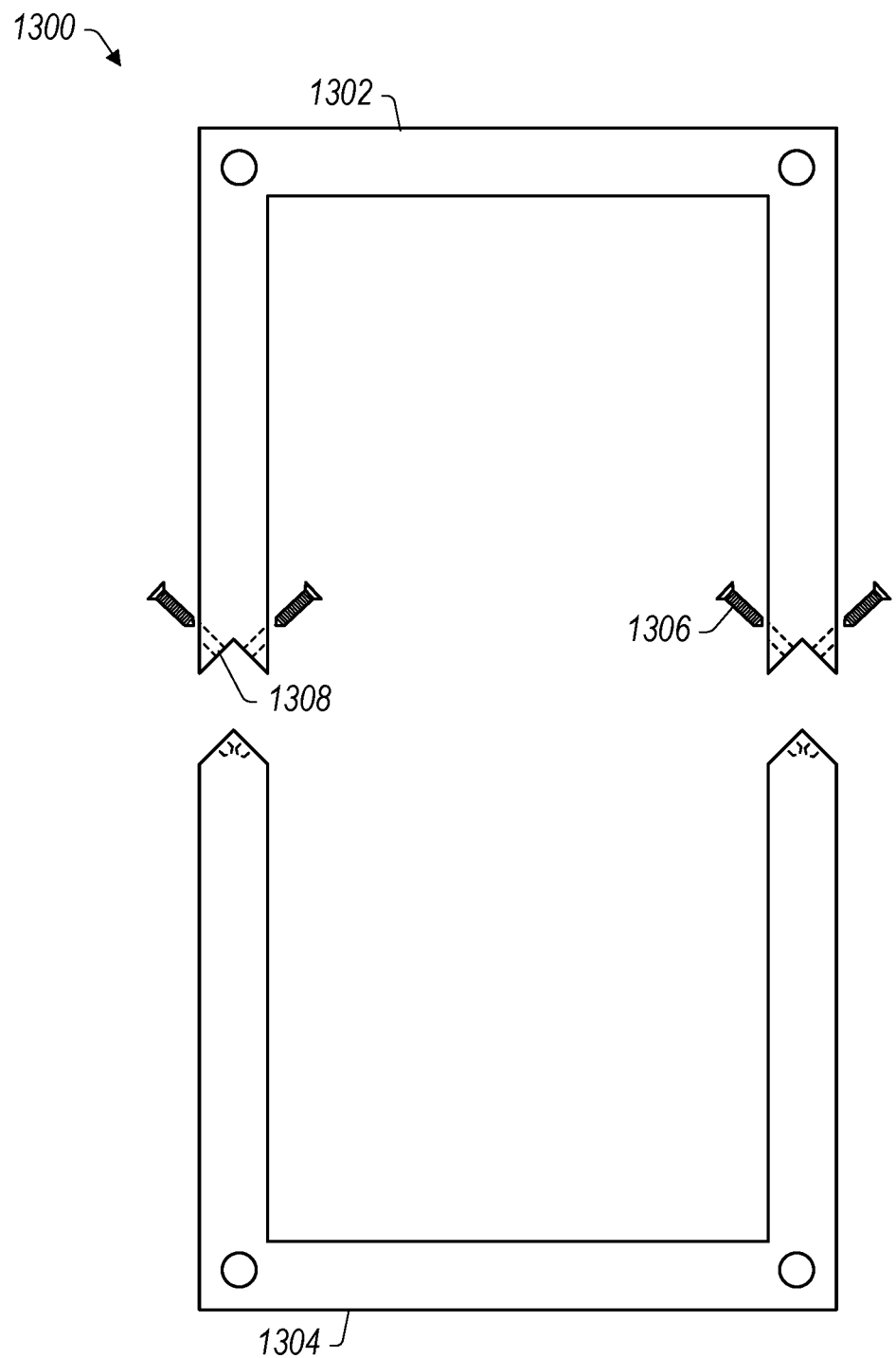
FIG. 13 is a top view of an upper mounting bracket that compliments mounting hardware for a particular type of processor and which may be used to couple a commonly designed heat exchanger to the particular type of processor, wherein the mounting bracket comprises a plurality of sections, according to some embodiments.

FIG. 13 is a top view of an upper mounting bracket that compliments mounting hardware for a particular type of processor and which may be used to couple a commonly designed heat exchanger to the particular type of processor, wherein the mounting bracket comprises a plurality of sections, according to some embodiments.

In some embodiments, any of the upper mounting brackets described herein may be made up of multiple "C" sections configured to fit around a tower heat exchanger/processor package arrangement. For example, upper mounting bracket 1300 includes "C" section 1302 and "C" section 1304 that couple together via bolt holes 1308 and bolts 1306 to surround a heat exchanger with which the upper mounting bracket 1300 is to engage with to mount the heat exchanger to a processor.

Figure 14:
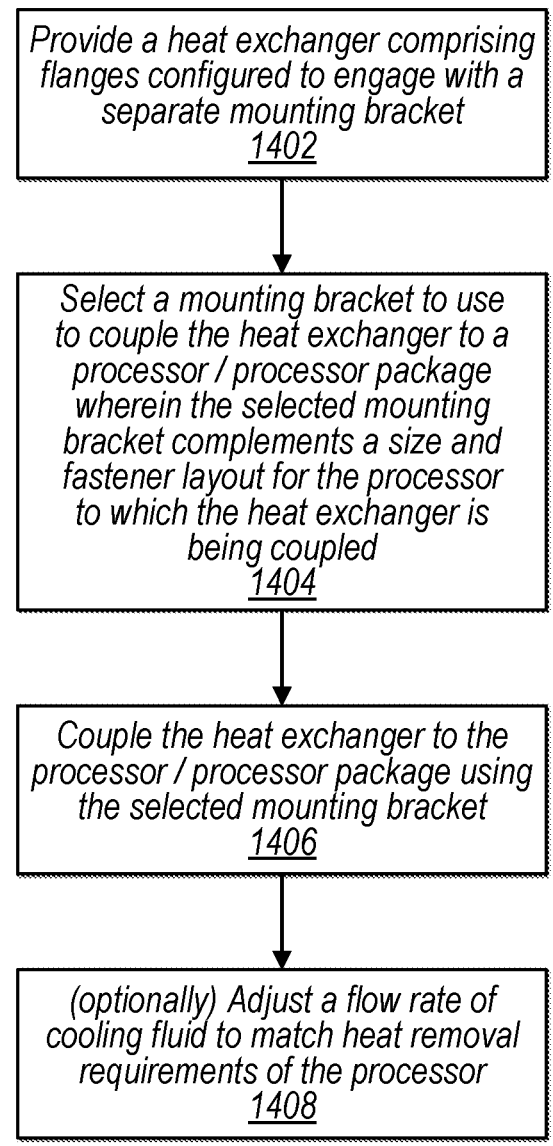
FIG. 14 illustrates a process of providing a processor assembly using a commonly designed heat exchanger and a separate upper mounting bracket that compliments mounting hardware for a particular type of processor, according to some embodiments.

FIG. 14 illustrates a process of providing a processor assembly using a commonly designed heat exchanger and a separate upper mounting bracket that compliments mounting hardware for a particular type of processor, according to some embodiments.

At block 1402, a heat exchanger comprising flanges configured to engage with any of a plurality of different types of separate mounting brackets is provided.

At block 1404, a particular mounting bracket is selected for use in coupling the heat exchanger to a processor/processor package wherein the selected mounting bracket complements a size and fastener layout for the processor to which the heat exchanger is being coupled.

At block 1406, the provided heat exchanger is coupled to the processor/processor package using the selected mounting bracket. For example, fasteners may be inserted through the fastener openings of the selected mounting bracket. The fasteners may engage with corresponding fasteners of the processor mounting hardware such as threaded holes, and may be tightened to exert a compressive force on the processor assembly to couple the heat exchanger to the processor/processor package.

At block 1408, a flow rate of cooling fluid may be adjusted to match heat removal requirements of the processor. For example, in the case of a pinned or finned heat sink, a fan speed setting may be adjusted. In the case of a cold-late a coolant flow rate may be adjusted.

Figure 15:
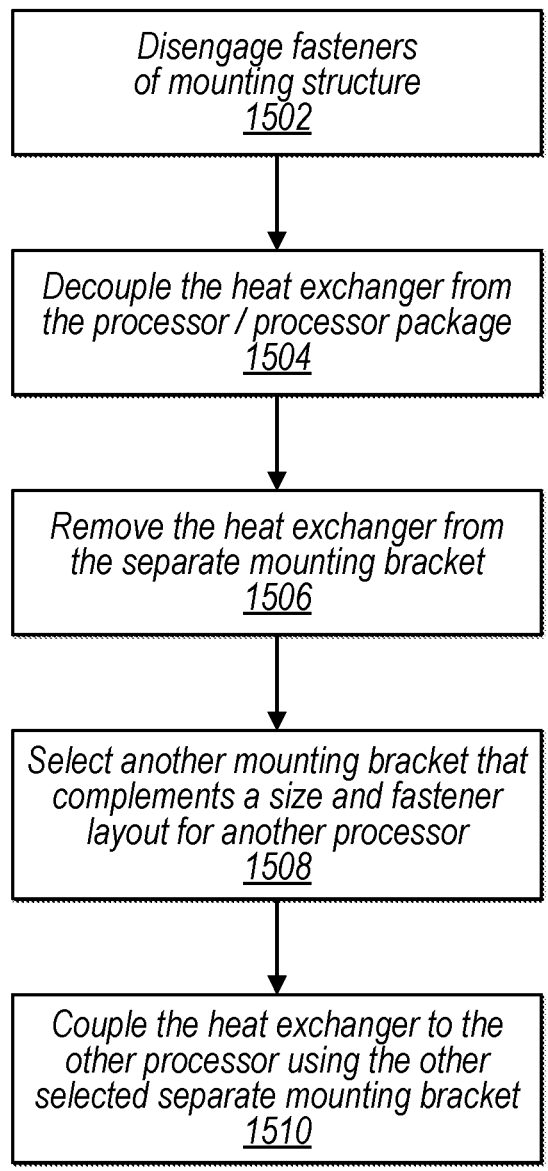
FIG. 15 illustrates a process of re-using a commonly designed heat exchanger for a processor having a different mounting hardware configuration than a first processor to which the commonly designed heat exchanger is coupled, according to some embodiments.

FIG. 15 illustrates a process of re-using a commonly designed heat exchanger for a processor having a different mounting hardware configuration than a first processor to which the commonly designed heat exchanger is coupled, according to some embodiments.

At block 1502, fasteners securing the heat exchanger to the processor/processor package via the selected mounting bracket may be loosened.

At block 1504, the heat exchanger may be decoupled from the first processor/processor package and at 1506 the heat exchanger may be removed from the first selected mounting bracket that complements the first processor.

At 1508, another mounting bracket that complements another processor may be selected for use in mounting the same heat exchanger that was previously mounted to the first processor to the other processor. The other mounting bracket may be selected to match mounting hardware dimensions and fastener patterns for the other processor.

At 1510, the same heat exchanger may be re-used and coupled to the other processor using the other selected mounting bracket.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method, comprising:
providing a heat exchanger for removing heat from a selected processor or a selected processor package selected from a plurality of different types of processors or different processor packages, wherein the heat exchanger comprises:
a surface configured to be positioned proximate to a surface of a package of the processor such that waste heat from the processor is conducted to the heat exchanger;
a heat transfer portion configured to transfer at least a portion of the heat conducted to the heat exchanger from the processor to a cooling fluid in fluid communication with the heat exchanger; and
mounting flanges extending out from respective sides of the heat exchanger,
wherein the mounting flanges are configured to engage with a mounting structure for coupling the heat exchanger to the selected processor or the selected processor package;
selecting the mounting structure for the heat exchanger from different mounting structures with which the mounting flanges of the heat exchanger are configured to engage, wherein:
respective ones of the different mounting structures have different lengths, widths, or bolt patterns;
the different types of processors or the different processor packages require different complementary mounting structures having the different lengths, widths, or bolt patterns to mount the heat exchanger to the different types of processors or the different processor packages, via a set of fasteners, wherein the heat exchanger is configured to be mounted on any of the different types of processors or the different processor packages via the different mounting structures with which the mounting flanges of the heat exchanger are configured to engage; and
the mounting flanges of the heat exchanger comprise open corners and center openings configured to accommodate passage of respective fasteners of the set of fasteners laid out according to the different lengths, widths, or bolt patterns of the selected mounting structure; and
coupling the heat exchanger with the selected processor or the selected processor package via the selected mounting structure that complements mounting hardware of the selected processor or the selected processor package.

2. The method of claim 1, wherein the heat transfer portion of the heat exchanger comprises:
a convection cooled heat sink; or
a liquid cooled cold plate.

3. The method of claim 1, wherein the mounting flanges extend out from respective first and second sides of the heat exchanger a distance such that the mounting flanges are configured to engage with the respective ones of the different mounting structures having different lengths, widths, or bolt patterns.

4. The method of claim 1, wherein the different types of processors or the different processor packages comprise processors designed or manufactured by different entities.

5. The method of claim 1, further comprising:
adjusting a flow rate of the cooling fluid that removes heat from the heat exchanger such that the heat exchanger removes waste heat from the selected processor or the selected processor package at a rate corresponding to a rate at which the selected processor or the selected processor package generates waste heat.

6. The method of claim 1, further comprising:
decoupling the heat exchanger from the selected processor or the selected processor package;
removing the heat exchanger from the selected mounting structure;
selecting another one of the mounting structures for the heat exchanger, wherein the selected other mounting structure complements mounting hardware of another selected processor or another selected processor package; and
coupling the heat exchanger with the other selected processor or other selected processor package via the selected other mounting structure that complements the mounting hardware of the other selected processor or other selected processor package.

7. A heat exchanger for removing waste heat from a selected processor or a selected processor package selected from a plurality of different types of processors or different processor packages, the heat exchanger comprising:
a surface configured to be positioned proximate to a surface of a package of the selected processor or the selected processor package such that waste heat from the selected processor or the selected processor package is conducted to the heat exchanger;
a heat transfer portion configured to transfer at least a portion of the heat conducted to the heat exchanger from the selected processor or the selected processor package to a cooling fluid in fluid communication with the heat exchanger; and
mounting flanges extending out from respective sides of the heat exchanger; wherein:
the heat exchanger is configured to be mounted on any of a plurality of the different types of processors or the different processor packages via different mounting structures with which the mounting flanges of the heat exchanger are configured to engage;
respective ones of the different mounting structures have different lengths, widths, or bolt patterns; and
the mounting flanges of the heat exchanger comprise open corners and center openings configured to accommodate passage of respective ones of a set of fasteners laid out according to the different lengths, widths, or bolt patterns.

8. The heat exchanger of claim 7, wherein the different types of processors or the different processor packages from which the heat exchanger is configured to remove waste heat comprise one or more of:
a central processing unit (CPU):
a graphics processing unit (GPU);
an application specific integrated circuit (ASIC); or
a field programmable gate array (FPGA).

9. The heat exchanger of claim 7, wherein the different types of processors or the different processor packages from which the heat exchanger is configured to remove waste heat comprise processors designed or manufactured by different entities.

10. The heat exchanger of claim 7, wherein the heat transfer portion comprises:
   fins; or
   pins,
   configured to transfer heat to air via convective heat transfer.

11. The heat exchanger of claim 7, wherein the heat transfer portion comprises:
   passages configured to flow a cooling fluid through the heat transfer portion to transfer heat from the heat transfer portion to the flowing cooling fluid.

12. The heat exchanger of claim 11, further comprising:
   hose or tube fittings configured to couple a hose or a tube to the heat transfer portion of the heat exchanger such that the cooling fluid flows into the heat transfer portion via the hose or tube and flows out of the heat transfer portion via another hose or tube.

13. The heat exchanger of claim 7, further comprising:
   an anti-tilt pin configured to slide into an anti-tilt hole of a respective one of the different mounting structures that is being used to mount the heat exchanger to the selected processor or the selected processor package.

14. A mounting assembly for mounting a heat exchanger to a processor, the mounting assembly comprising:
   a mounting bracket configured to accept the heat exchanger positioned within an opening in the mounting bracket, wherein the mounting bracket is further configured to engage flanges of at least four respective sides of the heat exchanger when the heat exchanger is positioned in the opening of the mounting bracket;
   fastener passages in the mounting bracket configured to accept fasteners that couple the mounting bracket to mounting hardware for the processor, wherein the fasteners, when coupled to the mounting hardware for the processor, cause the mounting bracket to exert a compressive force on the flanges of the heat exchanger; and
   an anti-tilt hole in the mounting bracket configured to accept insertion of an anti-tilt pin mounted at a first end on a given one of the flanges of the heat exchanger and extending up from the given flange, wherein the anti-tilt pin, when inserted in the anti-tilt hole, restricts rotation of the mounting bracket relative to the heat exchanger;
   wherein the fastener passages in the mounting bracket are positioned and sized to complement a corresponding fastener layout of the mounting hardware for the processor.

15. The mounting assembly of claim 14, wherein the mounting bracket further comprises:
   an additional anti-tilt hole configured to accept an additional anti-tilt pin extending up from a given one of the flanges of the heat exchanger; or
   an anti-tilt pin extending down from the mounting bracket and configured to fit into an anti-tilt hole in a given one of the flanges of the heat exchanger.

16. The mounting assembly of claim 14, further comprising:
   the fasteners, wherein the fasteners comprise screws or push pins.

17. The mounting assembly of claim 16, wherein the fasteners and an arrangement of the fastener passages in the mounting bracket are configured to:
   match corresponding bolt holes in the mounting hardware for the processor.

18. The mounting assembly of claim 17, wherein the fasteners are spring screws that exert a compressive force that corresponds to a fastener force requirement of the mounting hardware for the processor.

19. The mounting assembly of claim 14, wherein:
   the mounting hardware for the processor is coupled to a printed circuit board;
   the processor couples into a socket of the mounting hardware; and
   the compressive force exerted on the flanges of the heat exchanger by the mounting bracket causes the heat exchanger to exert a compressive force pushing down on the processor in the socket.

20. The mounting assembly of claim 14, wherein the mounting bracket comprises:
   a first "C" shaped section;
   a second "C" shaped section; and
   a set of fasteners configured to couple the first and second "C" shaped section together to surround the heat exchanger.

21. The mounting assembly of claim 14, further comprising:
   the heat exchanger positioned within the opening of the mounting bracket; and
   the fasteners positioned in the fastener passages,
   wherein the mounting assembly is configured to mount the heat exchanger to the processor via coupling the fasteners to the mounting hardware for the processor.

* * * * *